United States Patent
Liu et al.

(10) Patent No.: US 9,837,542 B2
(45) Date of Patent: Dec. 5, 2017

(54) POLYCRYSTALLINE SILICON THIN-FILM TRANSISTOR

(71) Applicant: BOE TECHNOLOGY GROUP CO., LTD., Beijing (CN)

(72) Inventors: Zheng Liu, Beijing (CN); Chunping Long, Beijing (CN); Yu-Cheng Chan, Beijing (CN); Xiaoyong Lu, Beijing (CN); Xialong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/104,504

(22) PCT Filed: Jul. 17, 2015

(86) PCT No.: PCT/CN2015/084319
§ 371 (c)(1),
(2) Date: Jun. 14, 2016

(87) PCT Pub. No.: WO2016/165223
PCT Pub. Date: Oct. 20, 2016

(65) Prior Publication Data
US 2017/0133512 A1     May 11, 2017

(30) Foreign Application Priority Data
Apr. 16, 2015    (CN) .......................... 2015 1 0182184

(51) Int. Cl.
*H01L 29/78*    (2006.01)
*H01L 29/66*    (2006.01)
(Continued)

(52) U.S. Cl.
CPC .. *H01L 29/78633* (2013.01); *H01L 21/02532* (2013.01); *H01L 21/02592* (2013.01);
(Continued)

(58) Field of Classification Search
CPC ......... H01L 29/78633; H01L 29/66757; H01L 29/78618; H01L 29/78675; H01L 29/78696; H01L 27/1222
See application file for complete search history.

(56) References Cited

U.S. PATENT DOCUMENTS 5,262,655 A * 11/1993 Ashida .............. H01L 29/66765
257/335
5,283,455 A *  2/1994 Inoue .................. H01L 29/6675
257/329
(Continued)

FOREIGN PATENT DOCUMENTS

| CN | 1638022 A | 7/2005 |
|---|---|---|
| CN | 1808694 A | 7/2006 |
| CN | 104779300 A | 7/2015 |

OTHER PUBLICATIONS

International Search Report and Written Opinion from PCT Application Serial No. PCT/CN2015/084319, dated Jan. 18, 2016, 12 pages.
(Continued)

*Primary Examiner* — Ida M Soward
(74) *Attorney, Agent, or Firm* — Kinney & Lange, P.A.

(57) ABSTRACT

A polycrystalline silicon thin-film transistor includes a substrate; an isolation layer formed on the substrate; and a polycrystalline silicon active layer formed on the substrate and the isolation layer, with two source-drain ion implantation regions being formed at both sides of the active layer, wherein the edges at both ends of the isolation layer are within the edges at both ends of the active layer. In the polycrystalline silicon thin-film transistor and the method for manufacturing the same, it is possible to increase the grain size of the active layer, improve the grain uniformity in a channel region thereof, effectively prevent deterioration
(Continued)

of characteristics of the active layer caused by backlight irradiation, and improve the reliability of the device.

18 Claims, 4 Drawing Sheets

(51) Int. Cl.
    *H01L 27/12*     (2006.01)
    *H01L 29/786*     (2006.01)
    *H01L 21/02*     (2006.01)
    *H01L 21/265*     (2006.01)

(52) U.S. Cl.
    CPC .. *H01L 21/02667* (2013.01); *H01L 21/26513* (2013.01); *H01L 27/1222* (2013.01); *H01L 29/66757* (2013.01); *H01L 29/78618* (2013.01); *H01L 29/78675* (2013.01); *H01L 29/78696* (2013.01)

(56) References Cited

U.S. PATENT DOCUMENTS

| | | | | |
|---|---|---|---|---|
| 5,348,903 A * | 9/1994 | Pfiester | ............. | H01L 21/76895 |
| | | | | 257/E21.59 |
| 5,698,882 A * | 12/1997 | Park | ............. | H01L 29/42384 |
| | | | | 257/344 |
| 5,767,530 A * | 6/1998 | Ha | ............. | H01L 29/66757 |
| | | | | 257/344 |
| 6,504,173 B2 * | 1/2003 | Hsu | ............. | H01L 29/78648 |
| | | | | 257/365 |
| 6,734,482 B1 * | 5/2004 | Tran | ............. | H01L 27/10814 |
| | | | | 257/296 |
| 6,774,454 B2 * | 8/2004 | Hirabayashi | ............. | H01L 21/3226 |
| | | | | 257/347 |
| 7,265,393 B2 * | 9/2007 | Schuele | ............. | H01L 27/12 |
| | | | | 257/135 |
| 7,948,027 B1 * | 5/2011 | Renn | ............. | H01L 21/84 |
| | | | | 257/329 |
| 9,224,755 B2 * | 12/2015 | Bedell | ............. | H01L 27/1218 |
| 9,293,540 B2 * | 3/2016 | Yamazaki | ............. | H01L 29/7869 |
| 2002/0160556 A1 * | 10/2002 | Yamazaki | ............. | G02F 1/13458 |
| | | | | 438/158 |
| 2008/0237781 A1 * | 10/2008 | Uchiyama | ............. | H01L 21/76264 |
| | | | | 257/508 |
| 2010/0258869 A1 * | 10/2010 | Morita | ............. | H01L 21/76283 |
| | | | | 257/347 |
| 2012/0104496 A1 * | 5/2012 | Botula | ............. | H01L 21/76264 |
| | | | | 257/347 |

OTHER PUBLICATIONS

Chinese Office Action for Chinese Patent Application No. 201510182184.2, dated Nov. 20, 2015, 10 pages.

* cited by examiner

POLYCRYSTALLINE SILICON THIN-FILM TRANSISTOR

TECHNICAL FIELD

The present disclosure relates to the field of display technology, and particularly to a polycrystalline silicon thin-film transistor and a method for manufacturing the same as well as a display device.

BACKGROUND ART

Relative to an amorphous silicon array substrates, a low-temperature polycrystalline silicon array substrate has advantages of high mobility, which may be hundreds times higher than that of amorphous silicon, very small size of thin-film transistor made therefrom, and a high response speed, so it is a type of array substrate for display panel which has been paid more and more attentions to, and has been more and more applied in organic electroluminescent displays and liquid crystal display panels with high resolution and high image quality. However, since the composition is generally complex and process procedures are numerous, particularly for a high-resolution display panel in which a plurality of thin-film transistors having very small sizes are often needed for the achievement of the process, electrical properties, and reliability of the thin-film transistor array substrate are even higher. In the structure of a polycrystalline silicon thin-film transistor in the prior art as shown in FIG. 1, 1 is a substrate, 2 is an active layer, 3 is a gate electrode insulating layer, 4 is a gate electrode, 5 is an intermediate insulating layer, and 6 is a via hole. Here, if a low-temperature polycrystalline silicon array substrate is used in an LCD display panel product, the backlight source may irradiate the channel region of the active layer for a long time, which results in the deterioration of properties of the device, and low reliability of the product. In addition, it is difficult for an active layer prepared by an excimer laser crystallization process to control grain size and uniformity of crystal grains in the channel region. Also, as seen from FIG. 1, it is required in the structure of the prior art to form a via hole by etching the intermediate insulating layer and the gate electrode insulating layer. Generally, the intermediate insulating layer has a very large thickness, which is thousands of Angstroms or more. Therefore, the requirement for via hole etching is relatively high, and an exclusively-used etching apparatus such as ICP, ECCP, etc., is needed to meet the requirement, and it is prone to overetch the active layer to cause damage or form a bad contact between source drain metals and the source drain regions.

SUMMARY

The present disclosure provides a polycrystalline silicon thin-film transistor and a method for manufacturing the same as well as a display device, so as to increase the grain size of the active layer, improve the uniformity of crystal grains in channel region thereof, and effectively prevent deterioration of characteristics of the active layer caused by backlight irradiation.

The present disclosure provides a polycrystalline silicon thin-film transistor, comprising:
a substrate;
an isolation layer formed on the substrate;
a polycrystalline silicon active layer formed on the substrate and the isolation layer, with two source-drain ion implantation regions being formed at both sides of the active layer,
wherein the edges at both ends of the isolation layer are within the edges at both ends of the active layer.

According to the disclosure of this application, the expression "the edges at both ends of the isolation layer are within the edges at both ends of the active layer" means that the projections of the edges at both ends of the isolation layer on the substrate fall in the range of and are less than the projections of the edges at both ends of the active layer on the substrate, implying that the size of the isolation layer is smaller than that of the active layer.

Furthermore, the polycrystalline silicon thin-film transistor further comprises:
an amorphous silicon layer formed between the substrate and the isolation layer, wherein the position of the amorphous silicon layer corresponds to that of the active layer, and two source-drain ion implantation regions are formed at both sides of the amorphous silicon layer.

Furthermore, the polycrystalline silicon thin-film transistor further comprises: a gate electrode insulating layer, a gate electrode, and an intermediate insulating layer sequentially formed on the active layer, as well as two via holes formed at both sides of the intermediate insulating layer and the gate electrode insulating layer.

Furthermore, the isolation layer is a single layer of silicon oxide or silicon nitride, or a stacked layer of both.

Furthermore, the amorphous silicon layer has a thickness of 1000 Å-5000 Å;
and/or, the isolation layer has a thickness of 500 Å-3000 Å.

Furthermore, projections of the amorphous silicon layer and of the active layer on the substrate are overlapped;
and/or, projections of the isolation layer and of the gate electrode on the substrate are overlapped.

In another aspect, the present disclosure also provides a method for manufacturing a polycrystalline silicon thin-film transistor, comprising:
forming a pattern of an isolation layer on a substrate;
depositing an amorphous silicon layer on the substrate and the isolation layer, allowing the amorphous silicon layer to be converted to a polycrystalline silicon layer, and forming a pattern of a polycrystalline silicon active layer; and
performing ion implantation on the active layer, to form two source-drain ion implantation regions at both sides of the active layer,
wherein the edges at both ends of the isolation layer are within the edges at both ends of the active layer.

Furthermore, the method further comprises:
forming a pattern of an amorphous silicon layer in a region on the substrate corresponding to the active layer; and
performing ion implantation on the active layer while performing ion implantation on the amorphous silicon layer, to form doped amorphous silicon layers at both sides of the amorphous silicon layer.

Furthermore, after said forming a pattern of an active layer and before said performing ion implantation on the active layer and on the amorphous silicon layer, the method further comprises: sequentially forming patterns of a gate electrode insulating layer and a gate electrode on the active layer; and
after said performing ion implantation on the active layer and on the amorphous silicon layer, the method further comprises: depositing an intermediate insulating layer on the gate electrode insulating layer and the gate electrode, and forming two via holes at both sides of the intermediate insulating layer and the gate electrode insulating layer.

Furthermore, the isolation layer is a single layer of silicon oxide or silicon nitride, or a stacked layer of both.

Furthermore, the pattern of the amorphous silicon layer and the pattern of the active layer are formed by photolithography using the same mask plate, respectively;

and/or, the pattern of the isolation layer and the pattern of the gate electrode are formed by photolithography using the same mask plate, respectively.

Furthermore, the energy of the ion implantation is 10-200 keV;

and/or, the dosage of the ion implantation is $1\times10^{11}$-$1\times10^{20}$ atoms/cm$^3$.

In yet another aspect, the disclosure also provides a display device, comprising any polycrystalline silicon thin-film transistor as described above.

Thus, in the polycrystalline silicon thin-film transistor and the method for manufacturing the same as well as the display device provided by the present disclosure, by disposing below the polycrystalline silicon active layer an isolation layer having edges at both ends within the edges at both ends of the active layer, it is possible to increase the grain size of the active layer, improve the uniformity of crystal grains in a channel region, and improve electrical properties of the device. At the meanwhile, the irradiation of backlight on the polycrystalline silicon active layer is also effectively blocked, and the deterioration of characteristics of the polycrystalline silicon active layer caused by backlight irradiation is effectively prevented.

In addition, by further disposing an amorphous silicon layer below the isolation layer, the polycrystalline silicon thin-film transistor and the method for manufacturing the same as well as the display device provided by the present disclosure can further block the irradiation of backlight on the polycrystalline silicon active layer and more effectively prevent the deterioration of characteristics of the polycrystalline silicon active layer caused by backlight irradiation, thereby improving reliability of the device. At the meanwhile, due to the presence of the amorphous silicon layer, even if the polycrystalline silicon active layer is damaged by a certain of overetching when etching source-drain via holes, it will not result in great effect on the properties of the device because the amorphous silicon layer may also act as an active layer. Therefore, it is not necessary to use expensive etching apparatuses exclusively used for preventing overetching, thereby lowering the production cost.

BRIEF DESCRIPTION OF DRAWINGS

In order to illustrate the technical solutions in the Examples of the present disclosure or in the prior art more clearly, figures required for describing the Examples or the prior art will be simply introduced below. It is apparent that the figures described below are some Examples of the present disclosure, and other figures may be further obtained by ordinary skilled person in the art according to these figures without exerting inventive work.

DESCRIPTION OF EMBODIMENTS

In order to make the objects, technical solutions, and the advantages of the Examples of the present disclosure more apparent, the technical solutions in the Examples of the present disclosure will be described clearly and fully below in conjunction with accompanying drawings in the Examples of the present disclosure. Obviously, the Examples described are a part of the Examples of the present disclosure, rather than all Examples. Based on the Examples in the present disclosure, all other Examples obtained by those of ordinary skill in the art without performing inventive work belong to the scope protected by the present disclosure.

Example 1

Figure 1:
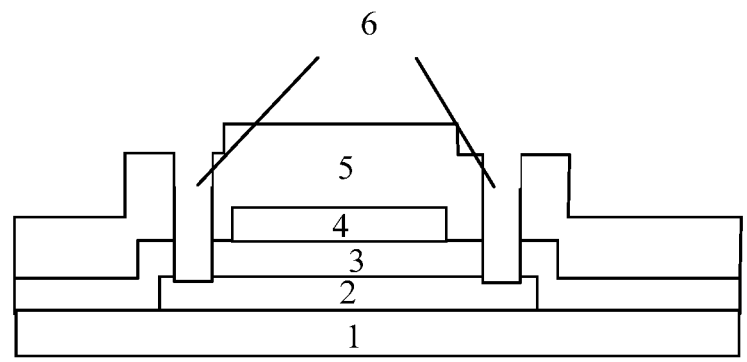
FIG. 1 is a structural schematic diagram of a polycrystalline silicon thin-film transistor in the prior art.
Figure 2:
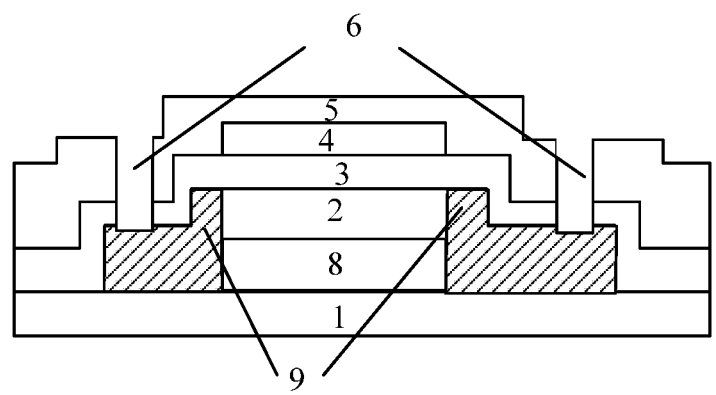
FIG. 2 is a structural schematic diagram of a polycrystalline silicon thin-film transistor in Example 1 of the present disclosure.

Example 1 of the present disclosure first provides a polycrystalline silicon thin-film transistor, as shown in FIG. 2, comprising:

a substrate 1;

an isolation layer 8 formed on the substrate 1;

a polycrystalline silicon active layer 2 formed on the substrate 1 and the isolation layer 8, and two source-drain ion implantation regions 9 formed at both sides of the active layer 2, wherein the edges at both ends of the isolation layer 8 are within the edges at both ends of the active layer 2.

Here, the polycrystalline silicon thin-film transistor may further comprise: a gate electrode insulating layer 3, a gate electrode 4, and an intermediate insulating layer 5 sequentially formed on the active layer 2, as well as two via holes 6 formed at both sides of the intermediate insulating layer 5 and the gate electrode insulating layer 3.

In addition, in this Example of the present disclosure, the active layer 2 may have a thickness of 100 Å-3000 Å, preferably 500 Å-1000 Å, and the forming method thereof may be PECVD, LPCVD, or a sputtering method, with a deposition temperature of 600° C. or less. The gate electrode insulating layer 3 may be a single layer of silicon oxide or silicon nitride, or a stacked layer of both, and may be deposited by a method such as PECVD, LPCVD, APCVD, ECR-CVD, etc., with a thickness of 500 Å-2000 Å. A suitable thickness may be selected according to a particular design requirement, and a preferable thickness is 600 Å-1500 Å. The gate electrode 4 may be a structure of a single layer, two layers, or more than two layers, and is composed of a metal or a metal alloy such as molybdenum, aluminum, molybdenum-tungsten, etc., with a thickness in a range of 1000 Å-5000 Å, preferably 1500 Å-4000 Å. The intermediate insulating layer 5 may be a single layer of silicon oxide or silicon nitride, or a stacked layer of both, and may be deposited by a method such as PECVD, LPCVD, APCVD, ECR-CVD, etc., with a thickness of 3000 Å-8000 Å. A suitable thickness may be selected according to a particular design requirement.

Here, the isolation layer 8 may be a single layer of silicon oxide or silicon nitride, or a stacked layer of both.

In the process of crystallization of the amorphous silicon active layer in this Example, since the edges at both ends of the isolation layer are within the edges at both ends of the active layer, a step structure is present such that the laser energy absorbed by the amorphous silicon active layer at both ends of the isolation layer is relatively low and only partial melting is allowed. Therefore, a polycrystalline silicon nucleation center is formed at this point to promote polycrystalline silicon to directionally grow along the channel and it is prone to form larger crystal grains, and it is also allowed to improve the uniformity of crystal grains in the channel region, and thereby electrical properties of the device may be improved. At the meanwhile, upon the use in display, since the isolation layer also effectively blocks the irradiation of backlight on the polycrystalline silicon active layer, the deterioration of characteristics of the polycrystalline silicon active layer caused by backlight irradiation is effectively prevented.

Example 2

Figure 3:
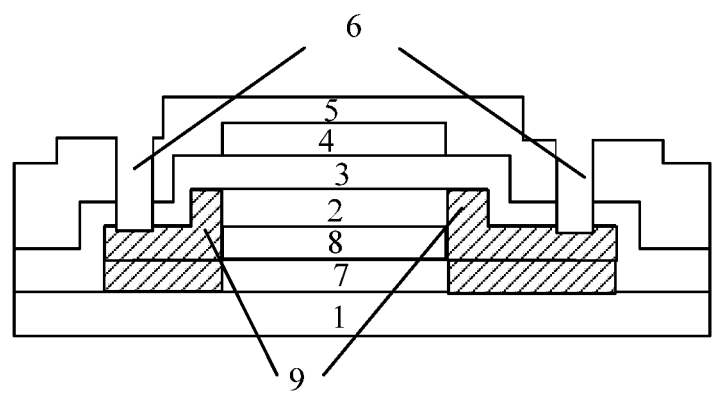
FIG. 3 is a structural schematic diagram of a polycrystalline silicon thin-film transistor in Example 2 of the present disclosure.

Example 2 of the present disclosure provides a polycrystalline silicon thin-film transistor. With reference to FIG. 3, on the basis of the structure of Example 1 of the present disclosure, it further comprises: an amorphous silicon layer 7 formed between the substrate 1 and the isolation layer 8, wherein the position of the amorphous silicon layer 7 corresponds to that of the active layer 2, and two source-drain ion implantation regions are also formed at both sides of the amorphous silicon layer 7. Since the requirement for via hole etching is relatively high in existing processes, and normal etching apparatuses are prone to overetch the active layer and cause damage or form a bad contact between source-drain metals and the source-drain region, exclusively-used etching apparatuses have to be used. However, due to the presence of the doped amorphous silicon layer 7 in the Example of the present disclosure, even if the polycrystalline silicon active layer 2 is overetched when forming via holes 6 on the intermediate insulating layer 5, a good contact will be still formed because the doped amorphous silicon layer 7 may also act as an active layer. The properties of the device will not be affected, and thereby exclusively-used etching apparatuses are not required when etching via holes. Also, since the amorphous silicon layer 7 may further block backlight irradiation on the active layer, the deterioration of characteristics of the polycrystalline silicon thin-film transistor caused by backlight irradiation is further prevented, and the reliability of the device is improved.

Optionally, the amorphous silicon layer 7 may have a thickness of 1000 Å-5000 Å, and its forming method may be PECVD, LPCVD, or a sputtering method, with a deposition temperature of 600° C. or less; and/or, the isolation layer 8 may have a thickness of 500 Å-3000 Å and may be deposited by a method such as PECVD, LPCVD, APCVD, ECR-CVD, etc.

Optionally, projections of the amorphous silicon layer 7 and the active layer 2 on the substrate 1 may be overlapped; and/or, projections of the isolation layer 8 and the gate electrode 4 on the substrate may be overlapped, so as to ensure that the pattern of the amorphous silicon layer and the pattern of the active layer are respectively formed by photolithography using the same mask plate; and/or, the pattern of the isolation layer and the pattern of the gate electrode are respectively formed by photolithography using the same mask plate, without increasing the number of mask plates, which simplifies the process for manufacturing the device and lowers manufacture cost.

In FIG. 3, the substrate 1 may be a preliminarily cleaned transparent substrate such as glass, etc. In order to prevent operating characteristics of TFT from being affected by the diffusion of metal ion impurities in the transparent substrate to the active layer, a buffering layer (not shown in FIG. 3) formed of silicon oxide, silicon nitride, or a stacked layer of both may be disposed between the substrate 1 and the amorphous silicon layer 7.

Example 3

Figure 4:
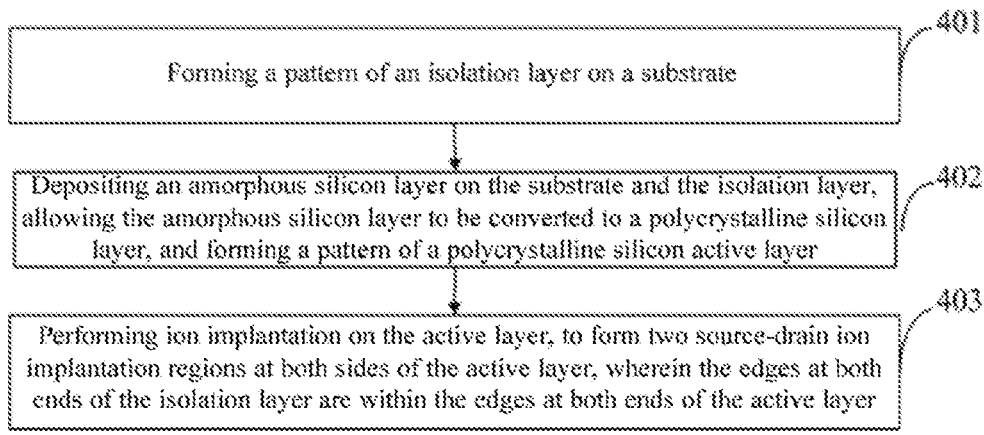
FIG. 4 is a flow chart of a method for manufacturing a polycrystalline silicon thin-film transistor in Example 3 of the present disclosure.

Example 3 of the present disclosure provides a method for manufacturing a polycrystalline silicon thin-film transistor, with reference to FIG. 4, comprising:

Step 401: forming a pattern of an isolation layer on a substrate;

Step 402: depositing an amorphous silicon layer on the substrate and the isolation layer, allowing the amorphous silicon layer to be converted to a polycrystalline silicon layer, and forming a pattern of a polycrystalline silicon active layer; and Step 403: performing ion implantation on the active layer, to form two source-drain ion implantation regions at both sides of the active layer, wherein the edges at both ends of the isolation layer are within the edges at both ends of the active layer.

In the process of crystallization of the amorphous silicon active layer in this Example, since the edges at both ends of the pre-formed isolation layer are within the edges at both ends of the active layer, a step structure is present such that the laser energy absorbed by the amorphous silicon active layer at both ends of the isolation layer is relatively low and only partial melting is allowed. Therefore, a polycrystalline silicon nucleation center is formed at this point to promote polycrystalline silicon to directionally grow along the channel and it is prone to form larger crystal grains, and it is also allowed to improve the uniformity of crystal grains in the channel region, and thereby electrical properties of the device may be improved. At the meanwhile, upon the use in display, since the isolation layer also effectively blocks the irradiation of backlight on the polycrystalline silicon active layer, the deterioration of characteristics of the polycrystalline silicon active layer caused by backlight irradiation is effectively prevented.

Here, the method may further comprises: forming a pattern of an amorphous silicon layer in a region on the substrate corresponding to the active layer; and performing ion implantation on the active layer while performing ion implantation on the amorphous silicon layer, to form doped amorphous silicon layers at both sides of the amorphous silicon layer, such that carriers at both sides of the amorphous silicon layer increase and may act as a part of the active layer, thereby improving properties of the device.

Since the requirement for via hole etching is relatively high in existing processes, and normal etching apparatuses are prone to overetch the active layer and cause damage or form a bad contact between source-drain metals and the source-drain region, exclusively-used etching apparatuses have to be used. However, due to the presence of the doped amorphous silicon layer in the Example of the present disclosure, even if the polycrystalline silicon active layer is overetched when forming via holes on the intermediate insulating layer, a good contact will be still formed because the doped amorphous silicon layer 7 may also act as an active layer. The properties of the device will not be affected, and thereby exclusively-used etching apparatuses are not required when etching via holes. Also, since the amorphous silicon layer may further block backlight irradiation on the active layer, and the deterioration of characteristics of the polycrystalline silicon thin-film transistor caused by backlight irradiation is further prevented, and the reliability of the device is improved.

Here, after forming a pattern of an active layer and before performing ion implantation on the active layer and on the amorphous silicon layer, it may further comprise: sequentially forming patterns of a gate electrode insulating layer and of a gate electrode on the active layer.

After performing ion implantation on the active layer and on the amorphous silicon layer, it may further comprise: depositing an intermediate insulating layer on the gate electrode insulating layer and the gate electrode, and forming two via holes at both sides of the intermediate insulating layer and the gate electrode insulating layer.

Here, the isolation layer may be a single layer of silicon oxide or silicon nitride, or a stacked layer of both.

Here, optionally, the amorphous silicon layer may have a thickness of 1000 Å-5000 Å; and/or, the isolation layer may have a thickness of 500 Å-3000 Å.

In order to achieve the object of improving the method for manufacturing polycrystalline silicon thin-film transistor in the Example of the present disclosure without increasing mask plates, the method in this Example of the disclosure may further comprise: using the same mask plate to form the pattern of the amorphous silicon layer and the pattern of the active layer by photolithography, respectively; and/or, using the same mask plate to form the pattern of the isolation layer and the pattern of the gate electrode by photolithography, respectively, such that projections of the formed amorphous silicon layer and of the active layer on the substrate are overlapped; and/or, projections of the isolation layer and of the gate electrode on the substrate are overlapped.

Optionally, methods such as ion implantation with a mass analyzer, ion cloud type implantation without a mass analyzer, plasma implantation, solid diffusion type implantation, etc., may be used as the process of ion implantation. In this Example, the mainstream ion cloud type implantation method may be used, and the implantation may be conducted using a mixed gas containing boron such as $B_2H_6/H_2$ or containing phosphorus such as $PH_3/H_2$ according to design requirements. The energy of the ion implantation is 10-200 keV, and preferably the energy is 40-100 keV. The dosage of the implantation is in a range of $1\times10^{11}$-$1\times10^{20}$ atoms/cm$^3$, and the suggested dosage is $1\times10^{14}$-$1\times10^{18}$ atoms/cm$^3$. In addition, in the particular process of manufacture, processes such as heat treatment dehydrogenation, deposition induction of metals, heat treatment crystallization, excimer laser irradiation crystallization, activation of doping impurities, etc., may be added as needed.

Optionally, before forming the amorphous silicon layer in a region on the substrate corresponding to the active layer, it may further comprise: forming a buffering layer on the substrate to prevent operating characteristics of TFT from being affected by the diffusion of metal ion impurities in the substrate to the active layer.

Example 4

Figure 5:
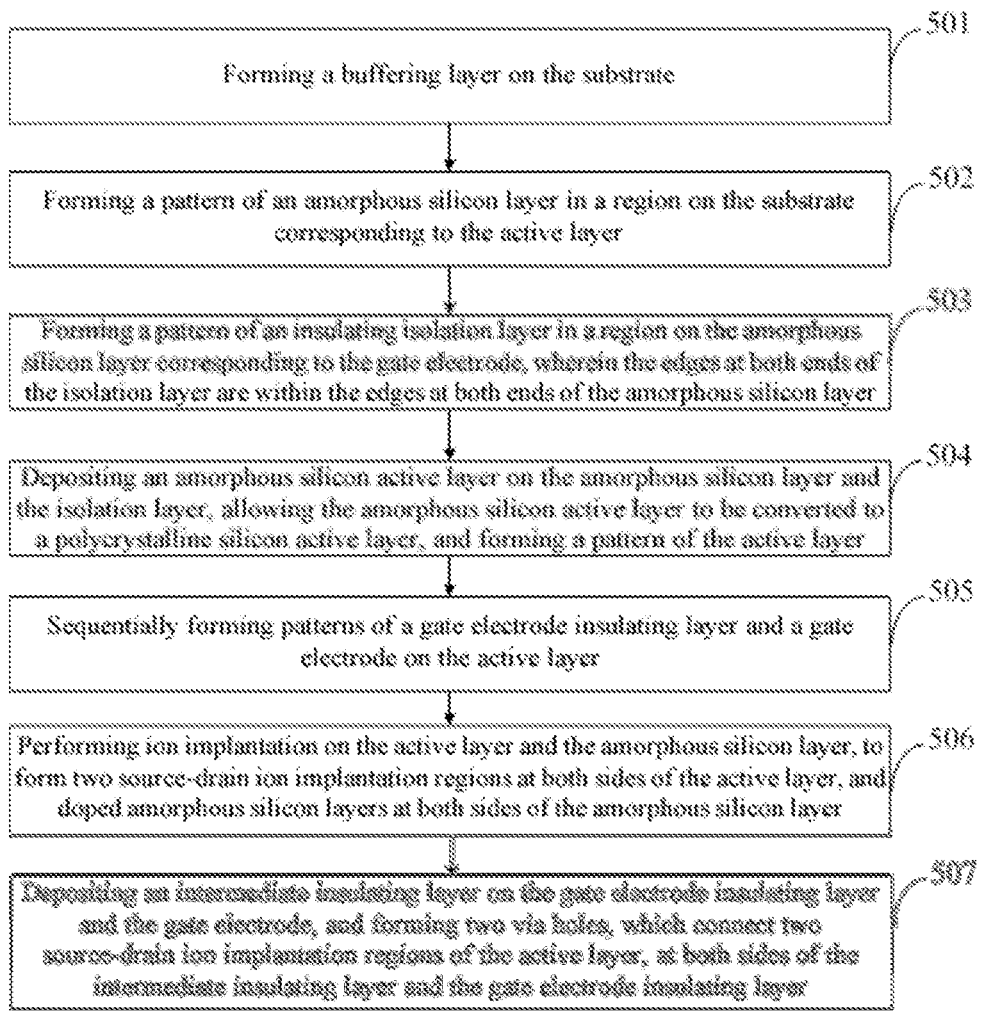
FIG. 5 is a flow chart of a method for manufacturing a polycrystalline silicon thin-film transistor in Example 4 of the present disclosure.

This example of the present disclosure provides a method for manufacturing a polycrystalline silicon thin-film transistor. With reference to FIG. 5, the method comprises:

Step 501: forming a buffering layer on the substrate.

In this step, the substrate 1 is a preliminarily cleaned transparent glass substrate. In order to prevent operating characteristics of TFT from being affected by the diffusion of metal ion impurities in the substrate to the active layer, a buffering layer formed of silicon oxide, silicon nitride, or a stacked layer of both may be first formed on the substrate 1.

Step 502: forming a pattern of an amorphous silicon layer in a region on the substrate corresponding to the active layer.

Figure 6:
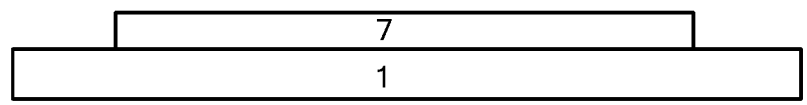
FIG. 6 is a schematic view for forming an amorphous silicon layer in Example 4 of the present disclosure.

In this step, with reference to FIG. 6, a pattern of an amorphous silicon layer 7 is formed in a region on the buffering layer of the substrate 1 corresponding to the active layer of the polycrystalline silicon thin-film transistor. Here, the amorphous silicon layer 7 has a thickness of 1000 Å-5000 Å, and its forming method may be PECVD, LPCVD, or a sputtering method, with a deposition temperature of 600° C. or less. At this time, in order to reduce the number of mask plates, the mask plate for the active layer of the polycrystalline silicon thin-film transistor is used to form the amorphous silicon layer 7 in this step.

Step 503: forming a pattern of an insulating isolation layer in a region on the amorphous silicon layer corresponding to the gate electrode, wherein the edges at both ends of the isolation layer are within the edges at both ends of the amorphous silicon layer.

Figure 7:
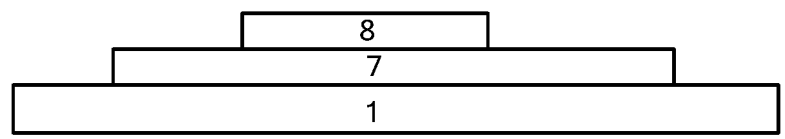
FIG. 7 is a schematic view for forming an isolation layer in Example 4 of the present disclosure.

In this step, with reference to FIG. 7, a pattern of an insulating isolation layer 8 is formed in a region on the amorphous silicon layer 7 corresponding to the gate electrode of the polycrystalline silicon thin-film transistor, wherein the edges at both ends of the isolation layer 8 are within the edges at both ends of the amorphous silicon layer 7, such that the both ends of the isolation layer 8 and the both ends of the amorphous silicon layer 7 form steps to prepare for the conversion of amorphous silicon to a nucleation center of polycrystalline silicon in subsequent steps. The isolation layer 8 may be a single layer of silicon oxide or silicon nitride, or a stacked layer of both, and may be deposited by a method such as PECVD, LPCVD, APCVD, ECR-CVD, etc., with a thickness of 500 Å-3000 Å. A suitable thickness may be selected according to a particular design requirement. Furthermore, in order to reduce the number of mask plates, the mask plate for the gate electrode of the polycrystalline silicon thin-film transistor is used to form the isolation layer 8 in this step.

Step 504: depositing an amorphous silicon active layer on the amorphous silicon layer and the isolation layer, allowing the amorphous silicon active layer to be converted to a polycrystalline silicon active layer, and forming a pattern of the active layer.

Figure 8:
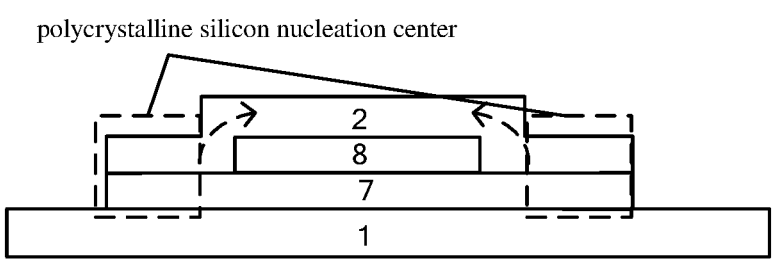
FIG. 8 is a schematic view for forming an active layer in Example 4 of the present disclosure.

In this step, with reference to FIG. 8, an amorphous silicon active layer is deposited on the amorphous silicon layer 7 and the isolation layer 8, and is crystallized to convert to a polycrystalline silicon active layer, and a pattern of active layer 2 is formed by using photolithographic process. After the deposition of the amorphous silicon active layer, it may be converted to a polycrystalline silicon active layer 2 by a method such as laser scanning, etc. In the process of crystallization, due to the presence of steps at both ends of the isolation layer 8 and of the amorphous silicon layer 7, the laser energy absorbed at the positions indicated by dashed lines is relatively low, and these positions are only partially melted. Therefore, a polycrystalline silicon nucleation center is formed, which promotes polycrystalline silicon to directionally grow along the channel (in a direction indicated by the arrows within dashed lines) and is prone to form larger crystal grains, and thereby electrical properties of the device may be improved.

Here, the active layer 2 has a thickness of 100 Å-3000 Å, and preferably a thickness of 500 Å-1000 Å. The forming method may be PECVD, LPCVD, or a sputtering method, with a deposition temperature of 600° C. or less.

Step 505: sequentially forming patterns of a gate electrode insulating layer and a gate electrode on the active layer.

Figure 9:
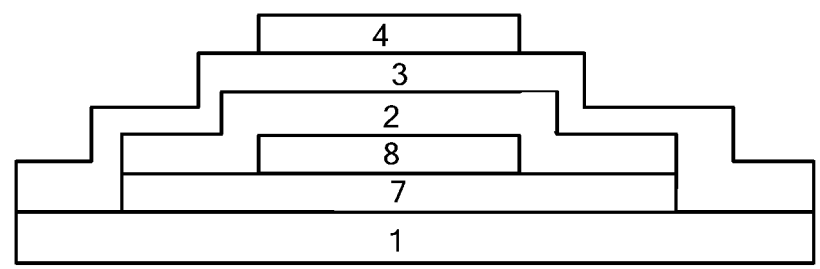
FIG. 9 is a schematic view for forming a gate electrode insulating layer and a gate electrode in Example 4 of the present disclosure.

With reference to FIG. 9, a gate electrode insulating layer 3 and a gate electrode 4 are sequentially formed on the active layer 2. Here, the gate electrode insulating layer 3 may be a single layer of silicon oxide or silicon nitride, or a stacked layer of both, and may be deposited by a method such as PECVD, LPCVD, APCVD, ECR-CVD, etc., with a thickness of 500 Å-2000 Å. A suitable thickness may be selected according to a particular design requirement, and the preferable thickness is 600 Å-1500 Å. The gate electrode 4 may be a structure of a single layer, two layers, or more than two layers, and is composed of a metal or a metal alloy such as molybdenum, aluminum, molybdenum-tungsten, etc., with a thickness in a range of 1000 Å-5000 Å, preferably a thickness of 1500 Å-4000 Å.

Step 506: performing ion implantation on the active layer and the amorphous silicon layer, to form two source-drain ion implantation regions at both sides of the active layer, and doped amorphous silicon layers at both sides of the amorphous silicon layer.

Figure 10:
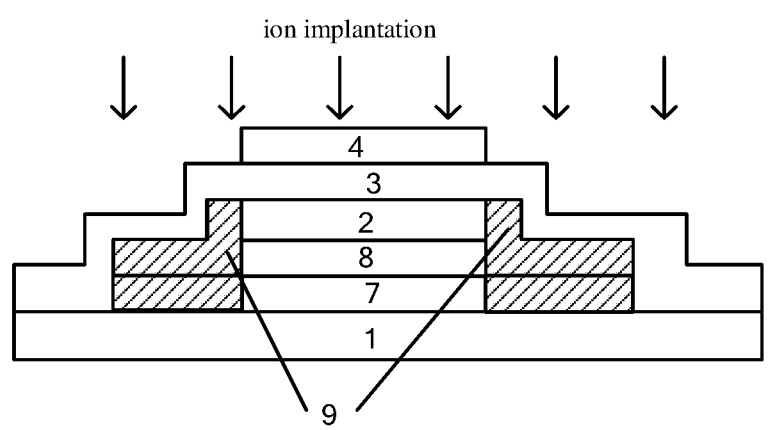
FIG. 10 is a schematic view of ion implantation in Example 4 of the present disclosure.

In this step, with reference to FIG. 10, ion implantation is performed on both the active layer 2 and the amorphous silicon layer 7 by using the gate electrode 4 as a mask plate. The mainstream ion cloud type implantation method may be used as the ion implantation process, and a mixed gas containing boron such as $B_2H_6/H_2$ or containing phosphorus such as $PH_3/H_2$ is used for implantation. The energy of the ion implantation is 10-200 keV, and the dosage of implantation is $1\times10^{14}$-$1\times10^{18}$ atoms/cm$^3$.

Step 507: depositing an intermediate insulating layer on the gate electrode insulating layer and the gate electrode, and forming two via holes, which connect two source-drain ion implantation regions of the active layer, at both sides of the intermediate insulating layer and the gate electrode insulating layer.

In this step, with reference to FIG. 3, the intermediate insulating layer 5 is deposited and the via holes 6 are formed. Due to the presence of the doped amorphous silicon layer 7, overetching of the active layer 2 may be effectively prevented and a good contact is formed. Here, the intermediate insulating layer 5 may be a single layer of silicon oxide or silicon nitride, or a stacked layer of both, and may be deposited by a method such as PECVD, LPCVD, APCVD, ECR-CVD, etc., with a thickness of 3000 Å-8000 Å. A suitable thickness may be selected according to a particular design requirement.

By far, the entire process of the method for manufacturing the polycrystalline silicon thin-film transistor in the Example of the present disclosure is finished.

Example 5

Example 5 of the present disclosure also provides a display device, comprising any of the polycrystalline silicon thin-film transistors as described above. It is to be understood that the display device typically comprises a display substrate and the polycrystalline silicon thin-film transistor is typically formed on a display substrate, which is, for example, an array substrate. The display device may be any apparatus or device with display function, such as a display panel, a display, a television, a cell phone, a navigator, an electronic book, a tablet computer, etc.

Finally, it is to be indicated that the above Examples are only to describe the technical solutions of the present disclosure rather than limitation. Although the present disclosure has been described in detail with reference to the aforementioned Examples, it is to be understood by the ordinary skilled person in the art that modifications may still be performed on the technical solutions disclosed by the aforementioned Examples, or equivalent replacements may be performed on a part of the technical features therein, and these modifications or replacements do not cause the essences of corresponding technical solutions depart from the spirit and the scope of the technical solutions of the Examples in the present disclosure.

What is claimed is:

1. A polycrystalline silicon thin-film transistor, comprising:
   a substrate;
   an isolation layer formed on the substrate;
   a polycrystalline silicon active layer formed on the substrate and the isolation layer, with two source-drain ion implantation regions being formed at both sides of the active layer,
   wherein the edges at both ends of the isolation layer are within the edges at both ends of the active layer.

2. A polycrystalline silicon thin-film transistor according to claim 1, further comprising:
   an amorphous silicon layer formed between the substrate and the isolation layer, wherein the position of the amorphous silicon layer corresponds to that of the active layer, and two source-drain ion implantation regions are formed at both sides of the amorphous silicon layer.

3. A polycrystalline silicon thin-film transistor according to claim 2, wherein the polycrystalline silicon thin-film transistor further comprises:
   a gate electrode insulating layer, a gate electrode, and an intermediate insulating layer sequentially formed on the active layer, as well as two via holes formed at both sides of the intermediate insulating layer and the gate electrode insulating layer.

4. A polycrystalline silicon thin-film transistor according to claim 3, wherein:
   projections of the amorphous silicon layer and the active layer on the substrate are overlapped; and/or
   projections of the isolation layer and the gate electrode on the substrate are overlapped.

5. A display device comprising the polycrystalline silicon thin-film transistor of claim 4.

6. A display device comprising the polycrystalline silicon thin-film transistor of claim 3.

7. A polycrystalline silicon thin-film transistor according to claim 2, wherein:
   the amorphous silicon layer has a thickness of 1000 Å-5000 Å; and/or
   the isolation layer has a thickness of 500 Å-3000 Å.

8. A display device comprising the polycrystalline silicon thin-film transistor of claim 7.

9. A display device comprising the polycrystalline silicon thin-film transistor of claim 2.

10. A polycrystalline silicon thin-film transistor according to claim 1, wherein the isolation layer is a single layer of silicon oxide or silicon nitride, or a stacked layer of both silicon oxide and silicon nitride.

11. A display device comprising the polycrystalline silicon thin-film transistor of claim 10.

12. A display device comprising a polycrystalline silicon thin-film transistor of claim 1.

13. A method for manufacturing a polycrystalline silicon thin-film transistor, comprising:
- forming a pattern of an isolation layer on a substrate;
- depositing an amorphous silicon layer on the substrate and the isolation layer, allowing the amorphous silicon layer to be converted to a polycrystalline silicon layer, and forming a pattern of a polycrystalline silicon active layer; and
- performing ion implantation on the active layer, to form two source-drain ion implantation regions at both sides of the active layer,
- wherein the edges at both ends of the isolation layer are within the edges at both ends of the active layer.

14. A method for manufacturing a polycrystalline silicon thin-film transistor according to claim 13, further comprising:
- forming a pattern of an amorphous silicon layer in a region on the substrate corresponding to the active layer; and
- performing ion implantation on the active layer while performing ion implantation on the amorphous silicon layer, to form doped amorphous silicon layers at both sides of the amorphous silicon layer.

15. A method for manufacturing a polycrystalline silicon thin-film transistor according to claim 14, wherein after said forming a pattern of an active layer and before said performing ion implantation on the active layer and on the amorphous silicon layer, the method further comprises:
- sequentially forming patterns of a gate electrode insulating layer and a gate electrode on the active layer; and
- after said performing ion implantation on the active layer and on the amorphous silicon layer, the method further comprises: depositing an intermediate insulating layer on the gate electrode insulating layer and the gate electrode, and forming two via holes at both sides of the intermediate insulating layer and the gate electrode insulating layer.

16. A method for manufacturing a polycrystalline silicon thin-film transistor according to claim 15, wherein:
- the pattern of the amorphous silicon layer and the pattern of the active layer are formed by photolithography using the same mask plate, respectively; and/or
- the pattern of the isolation layer and the pattern of the gate electrode are formed by photolithography using the same mask plate, respectively.

17. A method for manufacturing a polycrystalline silicon thin-film transistor according to claim 13, wherein the isolation layer is a single layer of silicon oxide or silicon nitride, or a stacked layer of both silicon oxide and silicon nitride.

18. A method for manufacturing a polycrystalline silicon thin-film transistor according to claim 13, wherein:
- the energy of the ion implantation is 10-200 keV; and/or
- the dosage of the ion implantation is $1\times10^{11}$-$1\times10^{20}$ atoms/cm$^3$.

* * * * *